United States Patent
Austin

(10) Patent No.: US 10,396,715 B2
(45) Date of Patent: Aug. 27, 2019

(54) HIGH POWER RADIO-FREQUENCY SWITCHING TOPOLOGY AND METHOD

(71) Applicant: SKYWORKS SOLUTIONS, INC., Woburn, MA (US)

(72) Inventor: Eric Emile Austin, Billerica, MA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

(21) Appl. No.: 15/834,573

(22) Filed: Dec. 7, 2017

(65) Prior Publication Data

US 2018/0167034 A1 Jun. 14, 2018

Related U.S. Application Data

(60) Provisional application No. 62/431,655, filed on Dec. 8, 2016.

(51) Int. Cl.
| | |
|---|---|
| *H03F 3/04* | (2006.01) |
| *H03F 1/02* | (2006.01) |
| *H03F 3/195* | (2006.01) |
| *H03F 3/213* | (2006.01) |
| *H04B 1/00* | (2006.01) |
| *H03F 1/56* | (2006.01) |
| *H03F 3/24* | (2006.01) |

(52) U.S. Cl.
CPC ............. *H03F 1/0205* (2013.01); *H03F 1/56* (2013.01); *H03F 1/565* (2013.01); *H03F 3/195* (2013.01); *H03F 3/213* (2013.01); *H03F 3/245* (2013.01); *H04B 1/00* (2013.01); *H04B 1/0064* (2013.01); *H03F 2200/423* (2013.01); *H03F 2200/451* (2013.01)

(58) Field of Classification Search
CPC ........ H03F 1/0205; H03F 3/245; H03F 1/565; H03F 3/195; H03F 1/56; H03F 3/213; H04B 1/00; H04B 1/0064
USPC .......................... 330/296, 286, 54, 311, 277
See application file for complete search history.

(56) References Cited

U.S. PATENT DOCUMENTS

2009/0085664 A1* 4/2009 Yang ................. H03F 1/0261
330/277

* cited by examiner

*Primary Examiner* — Khanh V Nguyen
*Assistant Examiner* — Khiem D Nguyen
(74) *Attorney, Agent, or Firm* — Lando & Anastasi, LLP

(57) ABSTRACT

Aspects and examples described herein provide a radio-frequency switching circuit, switching device, and related methods. In one example, a radio-frequency switching device includes an input path configured to receive a radio-frequency signal, a plurality of output paths each configured to provide the radio-frequency signal, and a plurality of radio-frequency sub-networks each coupled to the input path and configured to direct the radio-frequency signal, each of the plurality of sub-networks including at least a first radio-frequency circuit having a first series of directly biased transistors, a second radio-frequency circuit having a second series of directly biased transistors, and a direct current blocking network interposed between the first radio-frequency circuit and the second radio-frequency circuit, each output path of the plurality corresponding to at least one of the plurality of radio-frequency sub-networks.

21 Claims, 8 Drawing Sheets

HIGH POWER RADIO-FREQUENCY SWITCHING TOPOLOGY AND METHOD

CROSS-REFERENCE TO RELATED APPLICATIONS

This application claims the benefit under 35 U.S.C. § 119(e) of U.S. Provisional Application No. 62/431,655, titled "HIGH POWER RADIO-FREQUENCY SWITCHING TOPOLOGY AND METHOD," filed on Dec. 8, 2016 which is herein incorporated by reference in its entirety for all purposes.

BACKGROUND

Many communication terminal designs, such as those for smart-phones and tablets, require operation over numerous communication bands. For example, a typical radio-frequency base-station may connect one or more mobile devices to each other, or to a wider wireless network. These multi-band devices generally use one or more transmit/receive circuits to generate and amplify signals for transmission, or amplify signals once received. Often, these multi-band devices will include a single antenna to transmit and receive signals over the specified communication bands. However, more recently, multi-band devices may use multiple antennas, each communicating over various communication bands. Accordingly, typical multi-band devices require a switching element to direct the signal through the proper transmit or receive path. High power switching applications for radio frequency signals are typically addressed using one or more PIN diodes.

SUMMARY

Aspects and examples relate to electronic systems and, in particular, to radio-frequency transistor-based switching circuits. Various aspects and examples replace PIN diodes within a switching circuit with field effect transistors to enable high power radio-frequency switching based on a comparatively low direct current bias current or voltage. Particular aspects and examples may include one or more direct current bias networks, and one or more direct current blocking networks, for directly biasing each field effect transistor within the switching circuit. Such an arrangement allows the circuit to scale accordingly under increasingly large radio-frequency signal power. Moreover, the one or more direct current bias networks within the switching circuits of various examples individually bias each field effect transistor to ensure proper operation of each field effect transistor regardless of the radio-frequency signal power handling requirements of the circuit.

According to at least one aspect, provided is a radio-frequency circuit. In one example, the radio-frequency circuit comprises a series of transistors including at least a first transistor and a second transistor and each having at least a source, a gate, and a drain, and a plurality of direct current bias networks including a first direct current bias network coupled to the gate of the first transistor, a second direct current bias network coupled to the gate of the second transistor, and a third direct current bias network coupled to the drain of the first transistor and the source of the second transistor, each of the plurality of direct current bias networks being configured to directly bias the corresponding transistor to direct a radio-frequency signal through the series of transistors.

In one example, the radio-frequency circuit further comprises a first voltage distribution network coupled to the source of the first transistor and the third direct current bias network. In a further example, the radio-frequency circuit further comprises a second voltage distribution network coupled to the drain of the second transistor and the third direct current bias network. According to an example, the first transistor is a first field effect transistor and the second transistor is a second field effect transistor. In one example, the radio-frequency circuit further comprises a gate bias source coupled to the first direct current bias network and the second direct current bias network. According to one example, radio-frequency circuit further comprises a source/drain bias source coupled to the third direct current bias network.

According to certain examples, the radio-frequency circuit further comprises an input path configured to receive the radio-frequency signal, and an output path configured to provide the radio-frequency signal. In one example, the input path is configured to receive the radio-frequency signal in series or in shunt with the series of transistors. In a further example, the input path is configured to receive the radio-frequency signal from a transmission line of a radio-frequency power amplifier.

According to at least one example, the radio-frequency circuit further comprises a first direct current blocking network coupled to the output path of the radio-frequency circuit. In a further example, the radio-frequency circuit further comprises a second direct current blocking network coupled to the input path of the radio-frequency circuit.

In one example, at least one of the plurality of direct current bias networks is a ¼ wavelength transformer. According to another example, at least one of the plurality of direct current bias networks is an inductor circuit. In certain examples, the series of transistor are integrated within a shared die, and in some examples, the plurality of direct current bias networks is integrated within the shared die.

According to certain aspects, provided is a radio-frequency switching device. In one example, the radio-frequency switching device comprises an input path configured to receive a radio-frequency signal, a plurality of radio-frequency sub-networks each coupled to the input path and configured to direct the radio-frequency signal, each of the plurality of sub-networks including at least a first radio-frequency circuit having a first series of directly biased transistors, a second radio-frequency circuit having a second series of directly biased transistors, and a direct current blocking network interposed between the first radio-frequency circuit and the second radio-frequency circuit, and a plurality of output paths each configured to provide the radio-frequency signal, each output path of the plurality corresponding to at least one of the plurality of radio-frequency sub-networks.

According to certain examples, the radio-frequency switching device further comprises a plurality of transmission lines, at least one of the plurality of transmission lines being interposed between the input path and a corresponding one of the plurality of radio-frequency sub-networks. In a further example, each of the plurality of transmission lines is a ¼ wavelength transformer. According to one example, the first radio-frequency circuit further includes a first plurality of direct current bias networks configured to directly bias the first series of transistors, and the second radio-frequency circuit further includes a second plurality of direct current bias networks configured to directly bias the second series of transistors.

According to an example, the first radio-frequency circuit further includes a first voltage distribution network coupled to at least one of the first plurality of direct current bias networks, and the second radio-frequency circuit further includes a second voltage distribution network coupled to at least one of the second plurality of direct current bias networks. In one example, the first series of transistors includes a first transistor and a second transistor, and the second series of transistors includes a third transistor and a fourth transistor. According to an example, each of the first transistor, the second transistor, the third transistor, and the fourth transistor is a field effect transistor.

In one example, the plurality of radio-frequency sub-networks includes a first radio-frequency sub-network and a second radio-frequency sub-network, and the plurality of transmission lines includes a first transmission line and a second transmission line, the first transmission line being interposed between the first radio-frequency sub-network and the input path, and the second transmission line being interposed between the second radio-frequency sub-network and the input path. According to one example, the plurality of radio-frequency sub-networks further includes a third radio-frequency sub-network and a fourth radio-frequency sub-network, and the plurality of transmission lines further includes a third transmission line and a fourth transmission line, the third transmission line being interposed between the third radio-frequency sub-network and the input path, and the fourth transmission line being interposed between the fourth radio-frequency sub-network and the input path.

According to certain examples, at least one of the plurality of radio-frequency sub-networks is configured receive the radio-frequency signal in series or in shunt with the corresponding first series of transistors. In one example, the input path is configured to receive the radio-frequency signal from an output stage of a radio-frequency power amplifier.

According to certain aspects, provided is a method for providing a radio-frequency signal. According to one example, the method comprises receiving a radio-frequency signal at an input path, receiving a first direct current bias from a first direct current bias network at a gate of a first transistor, receiving a second direct current bias from a second direct current bias network at a gate of a second transistor, receiving a third direct current bias from a third direct current bias network at a drain of the first transistor and a source of the second transistor, directing the radio-frequency signal from the input path through the first transistor and the second transistor, and providing the radio-frequency signal at an output path.

In one example, the method further comprises distributing the third direct current bias to the source of the first transistor with a first voltage distribution network coupled to the direct current bias network. According to an example, the method further comprises distributing the third direct current bias to the drain of the second transistor with a second voltage distribution network coupled to the direct current bias network. In one example, the method further comprises blocking at least one of the first direct current bias and the second direct current bias with a direct current blocking network coupled to the output path. According to certain examples, receiving the radio-frequency signal at the input path includes receiving the radio-frequency signal in series or in shunt with the first transistor.

According to another aspect, provided is a communication terminal. In one example, the communication terminal comprises a transceiver configured to generate a radio-frequency signal, a radio-frequency module coupled to the transceiver and including at least one radio-frequency circuit, the radio-frequency circuit including a series of transistors and a plurality of direct current bias networks configured to directly bias the series of transistors to direct the radio-frequency signal, and an antenna in communication with the radio-frequency module, the antenna configured to transmit the radio-frequency signal.

In one example, the radio-frequency circuit includes the radio-frequency circuit as shown and described herein. In certain examples, the communication terminal further comprises a transmission line interposed between the transceiver and the radio-frequency module. In a further example, the transmission line includes a ¼ wavelength transformer. In one example, the communication terminal further comprises a power amplifier coupled to the radio-frequency circuit and configured to provide an amplified radio-frequency signal.

According to another aspect, provided is a radio-frequency circuit. In one example, the radio-frequency circuit comprises a gate bias source, a source/drain bias source, a plurality of switching circuits each coupled in parallel between the gate bias source and the source/drain bias source, and each including a corresponding transistor coupled in series with the corresponding transistor of each other switching circuit, and a direct current bias network interposed between the source/drain bias source and each switching circuit of the plurality of switching circuits.

In certain examples, each switching circuit of the plurality of switching circuits further includes an additional direct current bias network coupled between the gate bias source and the corresponding transistor. In one example, each switching circuit of the plurality of switching circuits further includes a voltage distribution network coupled to the corresponding transistor. According to at least one example, the corresponding transistor of each switching circuit is a field effect transistor having at least a gate, a source, and a drain.

According to one example, the plurality of switching circuits includes a first switching circuit and a second switching circuit, the additional direct current bias network of the first switching circuit and the second switching circuit being coupled to the gate of the corresponding field effect transistor. In one example, the voltage distribution network of the first switching circuit is coupled to the source of the corresponding field effect transistor, and the voltage distribution network of the second switching circuit is coupled to the drain of the corresponding field effect transistor. According to one example, the direct current bias network is coupled to the drain of the corresponding field effect transistor of the first switching circuit, and the source of the corresponding field effect transistor of the second switching circuit. In one example, the radio-frequency circuit further comprises a direct current blocking network coupled to at least one of the plurality of switching circuits.

Still other aspects, examples, and advantages of these exemplary aspects and implementations are discussed in detail below. Examples disclosed herein may be combined with other examples in any manner consistent with at least one of the principles disclosed herein, and references to "an example," "some example," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1A:
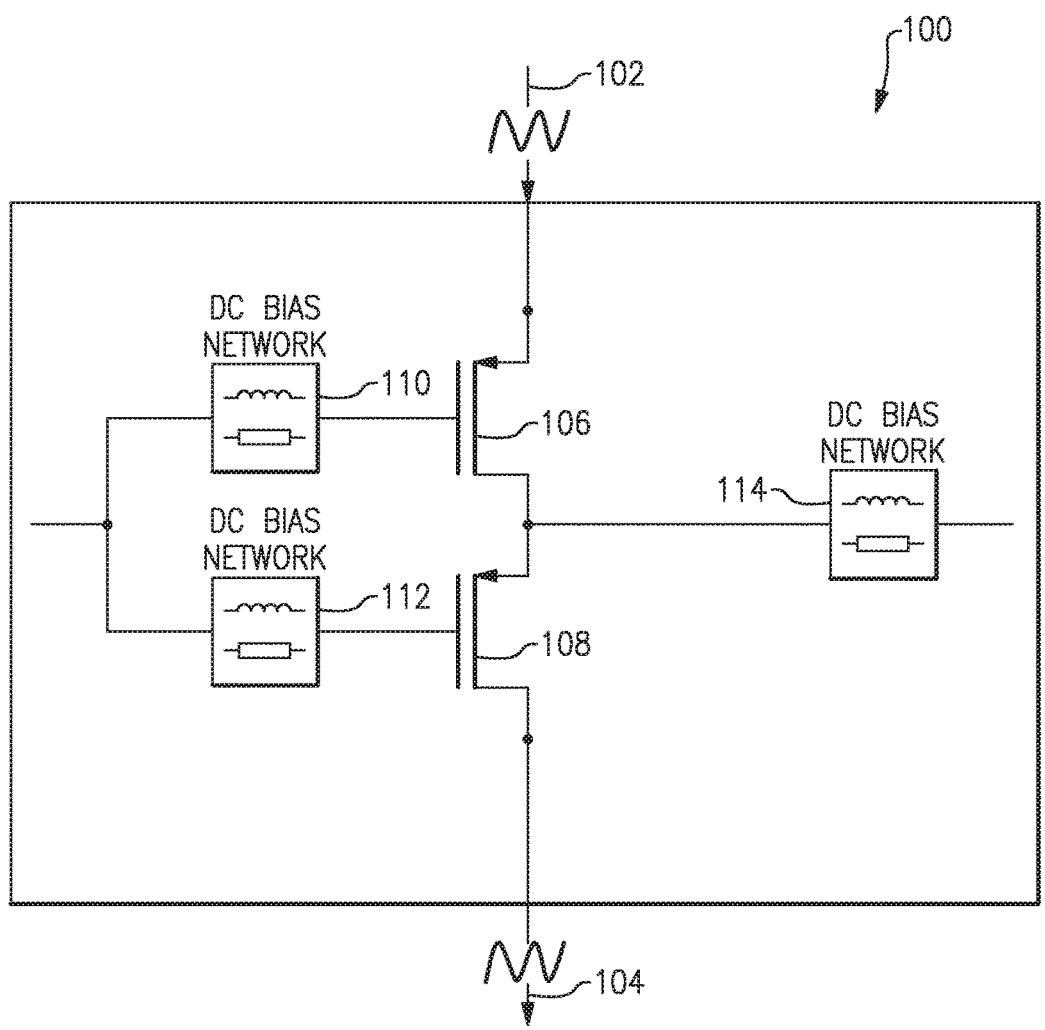
FIG. 1A is a block diagram of one example of a radio-frequency circuit according to aspects disclosed herein.

Aspects and examples relate to electronic systems and, in particular, to radio-frequency transistor-based switching circuits. Various aspects and examples replace PIN diodes with field effect transistors to enable high power radio-frequency switching based on a comparatively low direct current bias current or voltage. Particular aspects and examples may include one or more direct current bias networks individually coupled to a corresponding field effect transistor. Specifically, each direct current bias network may be configured to directly bias the corresponding field effect transistor. Certain aspects and examples may further include one or more direct current blocking networks. The direct current bias networks and direct current blocking networks of various examples permit the radio-frequency switching circuit to scale accordingly under increasingly large radio-frequency signal power, and ensure the proper operation of each field effect transistor within the circuit regardless of radio-frequency signal power handling requirements of the radio-frequency circuit.

As discussed above, high power switching applications for radio frequency signals are typically addressed using one or more PIN diodes. While PIN diodes offer improved switching speed when compared to conventional radio-frequency relays, they can require a significant direct current bias current or voltage to maintain, or switch, bias conditions. In modern communication terminals, such as base stations and wireless devices, available power is a significant design factor, and in certain instances, the required power to switch a PIN diode may not be available. Accordingly, PIN diodes are not suitable for all high power radio-frequency switching applications.

Various aspects and examples discussed herein provide high power switching functionality without the significant power (e.g., direct current bias current or voltage) requirements necessary to control PIN diodes during high power/voltage radio-frequency signal conditions. This capability may be highly desirable in numerous applications. For example, in many communication terminals it is desirable that component devices exhibit stable performance over a wide variety of radio-frequency signal conditions. Aspects and examples of the radio-frequency circuits, devices, modules, and processes discussed herein can meet these objectives for a range of such conditions, providing stable performance regardless of the radio-frequency signal power. Specifically, aspects and examples may be adapted to scale according to radio-frequency signal power handling requirements, and may enable low power control (e.g., low direct current bias current or voltage) during high power/voltage radio-frequency signals conditions. Accordingly, various aspects and examples disclosed herein may provide important functionality that is not available from conventional radio-frequency devices.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1A is a block diagram of one example of a radio-frequency circuit 100 according to certain aspects and implementations. As illustrated, the radio-frequency circuit 100 may include a series of transistors including at least a first transistor 106 and a second transistor 108, each having at least a source, a gate, and a drain, and a plurality of direct current bias networks including a first direct current bias network 110 coupled to the gate of the first transistor 106, a second direct current bias network 112 coupled to the gate of the second transistor 108, and a third direct current bias network 114 coupled to the drain of the first transistor 106 and the source of the second transistor 108. Each of the plurality of direct current bias networks 110, 112, 114 may directly bias the corresponding transistor to direct a radio-frequency signal through the series of transistors 106, 108. As further illustrated in FIG. 1A, the radio-frequency circuit 100 may further include an input path 102 to receive the radio-frequency signal and an output path 104 to provide the radio-frequency signal.

Figure 1B:
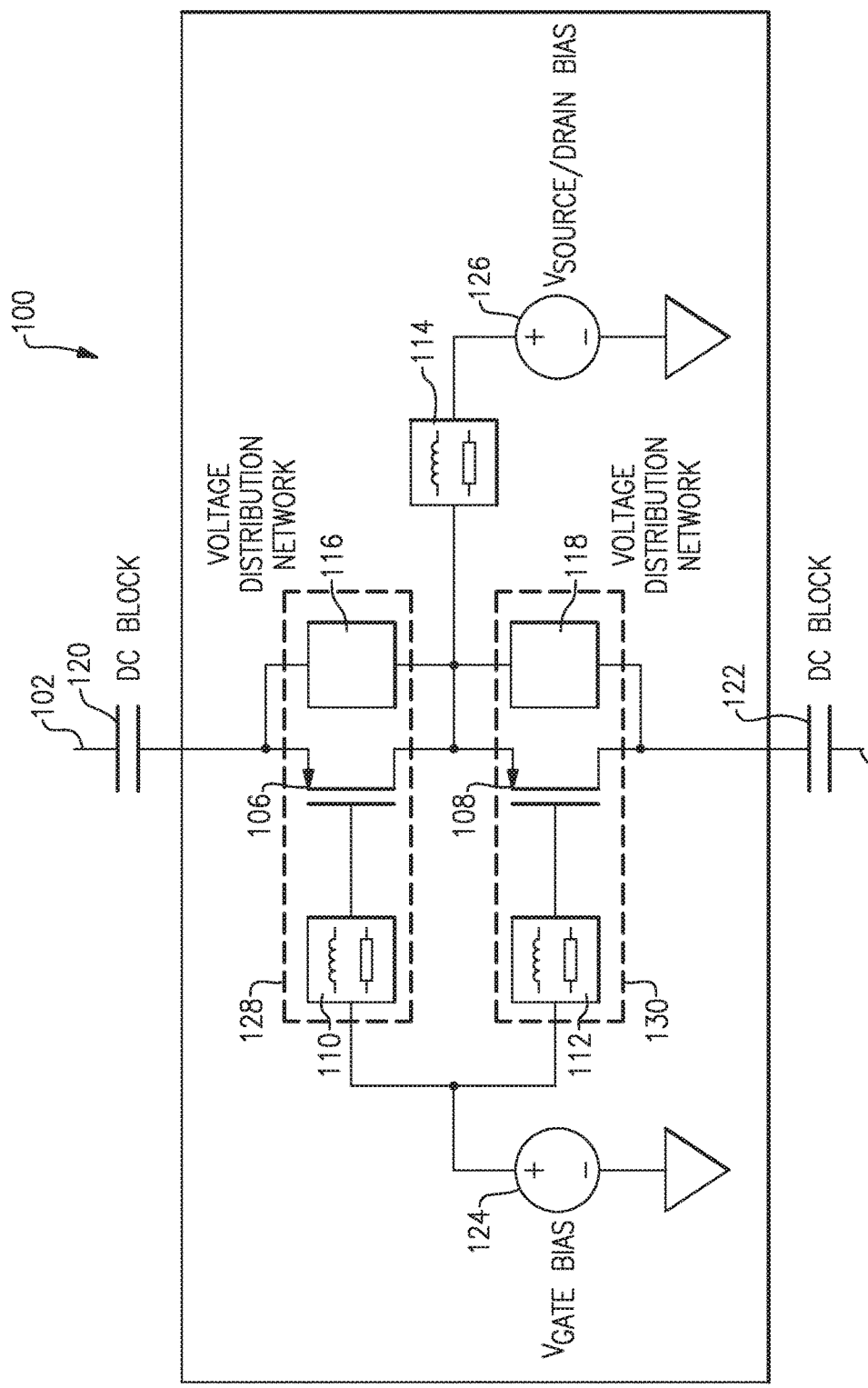
FIG. 1B is a more comprehensive block diagram of the radio-frequency circuit of FIG. 1A, according to aspects disclosed herein.

FIG. 1B is more comprehensive block diagram of the radio-frequency circuit 100 shown in FIG. 1A. That is, FIG. 1B illustrates one example of the radio-frequency circuit 100 which further includes a plurality of voltage distribution networks (e.g., a first voltage distribution network 116 and a second voltage distribution network 118) and one or more direct current blocking networks (e.g., a first direct current blocking network 120 and a second direct current blocking network 122). Each direct current bias network 110, 112, 114 may be coupled to a corresponding bias source, such as the gate bias source 124 and the source/drain bias source 126 illustrated in FIG. 1B. The first and second direct current bias networks 110, 112 are coupled to the gate bias source 124, and the third direct current bias network 114 is coupled to the source/drain bias source 126. Specifically, in FIG. 1B, the first direct current bias network 110 is interposed between the gate of the first transistor 106 and the gate bias source 124, and the second direct current bias network 112 is interposed between the gate of the second transistor 108 and the gate bias source 124. In FIG. 1B, the third direct current bias network 114 is interposed between a common connection between the drain of the first transistor 106 and the source of the second transistor 108, and the source/drain bias source 126.

While FIG. 1 illustrates the gate bias source 124 as a single bias source, in other examples the radio-frequency circuit 100 may include a separate bias source for the gate of each transistor 106, 108. For instance, the radio-frequency circuit 100 may include a first gate bias source coupled to the first direct current bias network 110, and a second gate bias source coupled to the second direct current bias network 112. As further described below with reference to at least FIG. 4, various components of the radio-frequency circuit 100 may be integrated within a shared die and may be packaged within the same radio-frequency module.

Though the components of several views of the drawings herein may be shown and described as discrete elements in a block diagram and may be referred to as "circuit" or "circuitry," unless otherwise indicated, the elements may be implemented as one of, or a combination of, analog circuitry, digital circuitry, or one or more microprocessors executing software instructions. Unless otherwise indicated, signal lines may be implemented as discrete analog or digital signal lines. Unless otherwise indicated, signals may be encoded in either digital or analog form; conventional digital-to-analog or analog-to-digital converters may not be shown in the drawings.

According to various examples, the illustrated radio-frequency circuit 100 may be configured to receive a radio-frequency signal at the input path 102 and route the radio-frequency signal through the series of transistors 106, 108 to the output path 104. In various implementations, the radio-frequency circuit 100 may be configured to receive the radio-frequency signal in series or in shunt with the series of transistors 106, 108. According to certain examples, the radio-frequency circuit 100 may be used to provide one or more switching operations to selectively permit communication of the radio-frequency signal from the input path 102 to the output path 104. For example, the input path 102 may be coupled to an output transmission line of a radio-frequency power amplifier. In various examples, the radio-frequency signal may be used for various purposes, such as selectively driving the antenna of a communication terminal. Accordingly, the radio-frequency circuit 100 may be included in numerous devices in which management of a radio-frequency signal is important, such as a base-station or a wireless device (e.g., a mobile phone).

In certain examples, each transistor (e.g., the first transistor 106 and the second transistor 108) within the series of transistors includes a three-terminal transistor, such as a field effect transistor having a gate, source, and drain. Specifically, each of the first transistor 106 and second transistor 108 may include a field effect transistor manufactured from gallium arsenide (GaAs), gallium nitride (GaN), indium gallium arsenide (InGaAs), or any other suitable material. While in one example, each transistor 106, 108 may be a metal-oxide-semiconductor field-effect transistor, in various examples, the particular type of field effect transistor may depend on the application and the circuit design requirements. In particular examples, field effect transistors offer a benefit of a lower switching bias current or voltage when compared to conventional PIN diodes.

In certain other examples, each transistor within the series of transistors may include a field effect transistor having more than three terminals. For instance, the first transistor 106 and the second transistor 108 may include a four-terminal or five-terminal field effect transistor having a gate, source, drain, body, and/or substrate. That is, the type and configuration of each transistor 106, 108 within the series of transistors may include any suitable transistor and may be chosen based on the desired application and performance of the radio-frequency circuit 100.

The radio-frequency circuit 100 illustrated in FIG. 1B includes two transistors for the convenience of illustration, and in various other examples any suitable number of transistors may be included within the radio-frequency circuit 100. Specifically, the radio-frequency circuit 100 may be scaled according to increasing radio-frequency signal power conditions by the addition of one or more transistors (and corresponding direct current bias networks and/or voltage distribution networks). For example, the number of transistors within the given circuit 100 may be a function of the highest radio-frequency signal power that the radio-frequency circuit 100 is required to receive, the frequency of operation of the received radio-frequency signal, and the processes used to manufacture the transistors. In particular, the number of transistors coupled in series may be proportional to the breakdown voltage of the manufacturing process, and the maximum radio-frequency signal voltage.

In the illustrated example of FIGS. 1A-1B, each direct current bias network 110, 112, 114 is coupled to at least one of the transistors 106, 108 and configured to apply a current or voltage (e.g., direct current bias current or voltage) to bias the corresponding transistor 106, 108. According to various examples, each direct current bias network 110, 112, 114 may be driven by the coupled bias source. Application of the bias current or voltage from the direct current bias source may switch the corresponding transistor 106, 108 between one or more desired states of operation (i.e., saturation mode or cutoff mode). That is, each transistor 106, 108 may be dynamically controlled between an "ON" state and an "OFF" state, or between the "OFF" state and the "ON" state. Control of each transistor 106, 108 between the "ON" state and the "OFF" state, or vice versa, will control the propagation of the radio-frequency signal from the input path 102 to the output path 104, as will be understood to one skilled in the art.

As discussed with reference to FIG. 1A, in FIG. 1B the first direct current bias network 110 is coupled to the gate of the first transistor 106, and the second direct current bias network 112 is coupled to the gate of the second transistor 108. Each of the first direct current bias network 110 and the second direct current bias network 112 is also coupled to the gate bias source 124. The gate bias source 124 may include a power source configured to provide a gate bias signal (e.g., direct current bias current or voltage) to the first direct current bias network 110 and the second direct current bias network 112. Based on the received gate bias signal, the first direct current bias network 110 may deliver a first bias current or voltage to the gate of the first transistor 106. Similarly, based on the received gate bias signal, the second direct current bias network 112 may deliver a second bias current or voltage to the gate of the second transistor 108.

In certain examples, the third direct current bias network 114 is coupled to at least one of the source and the drain of the first transistor 106, and at least one of the source and the drain of the second transistor 108. In the illustrated example, the third direct current bias network 114 is coupled to a common connection between the drain of the first transistor 106 and the source of the second transistor 108. The radio-frequency circuit 100 also includes a first voltage distribution network 116 interposed between the third direct current bias network 114 and the first transistor 106, and a second voltage distribution network 118 interposed between the third direct current bias network 114 and the second transistor 108.

In the illustrated example, the third direct current bias network 114 is coupled via the first voltage distribution network 116 to the source of the first transistor 106, and coupled via the second voltage distribution network 118 to the drain of the second transistor 108. The source/drain bias source 126 may include a power source configured to provide a source/drain bias signal (e.g., direct current bias current or voltage) to the third direct current bias network 114. Based on the received source/drain bias signal, the third direct current bias network 114 may apply a corresponding third bias current or voltage to the source and/or drain of the first transistor 106 and the source and/or drain of the second transistor 108.

According to certain examples, each of the first direct current bias network 110, the second direct current bias network 112, and the third direct current bias network 114 may include a ¼ wave transformer, or an inductor circuit. In various examples, the ¼ wave transformer transforms the impedance of the output end of the ¼ wave transformer (e.g., the transistor end of the ¼ wave transformer) such that the output end appears as a compliment of the input end (e.g., the bias source end). For example, the each ¼ wave transformer may be implemented with a quarter wavelength of transmission line fabricated on a respective substrate. As discussed herein, the quarter wavelength refers to the wavelength of the radio-frequency signal which is received at the input path 102 and propagates along the length of the respective ¼ wave transformer.

In certain other examples, each ¼ wave transformer may include a pi-network including a first shunt capacitor, a series inductor, and a second shunt capacitor coupled to form a low-loss network with an electrical length of approximately 90 degrees at the designed radio-frequency signal frequency. Each ¼ wave transformer, however implemented, is coupled in series (e.g., cascaded) with the respective bias source 124, 126 and load (e.g., the source, drain, or gate of the respective transistors 106, 108).

Each of the first voltage distribution network 116 and the second voltage distribution network 118 may include a plurality of circuit components arranged to distribute the bias current or voltage received from the third direct current bias network 114 to one or both of the source and drain of the corresponding transistors 106, 108. For instance, each voltage distribution network 116, 118 may include a plurality of resistors, or a plurality of resistors coupled in parallel with one or more capacitors. As illustrated in FIG. 1B, the first voltage distribution network 116 may be coupled in parallel with the first transistor 106 and the second voltage distribution network 118 may be coupled in parallel with the second transistor 108. The particular value of the resistors or capacitors of the voltage distribution networks 116, 118 may depend on the particular performance parameters of the associated transistors 106, 108 and the particular specifications of the associated radio-frequency circuit 100. Moreover, the values of each component of the voltage distribution networks 116, 118 may vary based on fabrication processes.

In certain examples, each voltage distribution network 116, 118 is configured to equally divide the received voltage across each transistor 106, 108 in the radio-frequency circuit 100, and in particular, when each of the transistors 106, 108 is biased in the OFF state. While in some examples, each voltage distribution network 116, 118 may be formed on a shared die with the transistors 106, 108, in certain other examples each of the voltage distribution networks 116, 118 may be formed on a separate die and implemented on a shared substrate. Such an arrangement may depend on the available manufacturing processes and/or the values of the resistors and capacitors.

Accordingly, each direct current bias network 110, 112, 114 may be operated with each voltage distribution network 116, 118 to maintain the first transistor 106 and the second transistor 108 within a desired state of operation (i.e., saturation mode or cutoff mode) to provide switching operations for the received radio-frequency signal.

As further illustrated in the example of FIG. 1B, one or more direct current blocking networks 120, 122 may be coupled to the output path 104 and/or the input path 102 of the radio-frequency circuit 100. For example, the radio-frequency circuit 100 may include a first direct current blocking network 120 coupled to the input path 120 and a second direct current blocking network 122 coupled to the output path 104. Each direct current blocking network 120, 122 provides a low impedance to the radio-frequency signal and a high impedance to the direct current bias currents and/or voltages. In at least one example, each direct current blocking network 120, 122 may include a capacitor having a chosen capacitance value based on the particular application of the radio-frequency circuit 100 and/or the radio-frequency signal power.

Figure 1C:
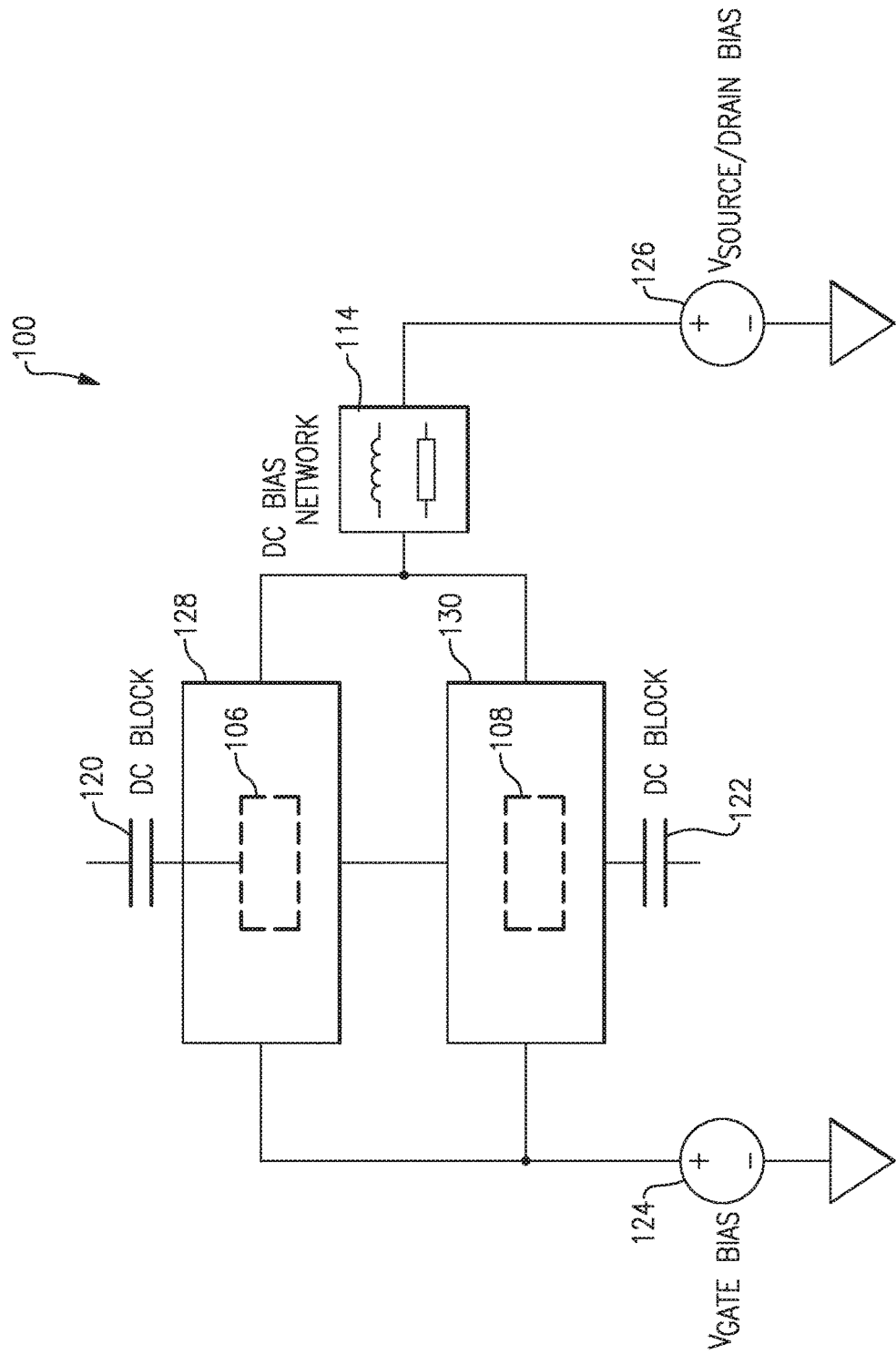
FIG. 1C is a simplified block diagram of the radio-frequency circuit of FIG. 1B, according to aspects disclosed herein.

FIG. 1C illustrates one example of a simplified block diagram of the radio-frequency circuit 100 illustrated in FIG. 1B. In particular, FIG. 1C shows the first transistor 106, the first direct current bias network 110, and the first voltage distribution network 116 arranged as a first switching circuit 128. FIG. 1C further shows the second transistor 108, the second direct current bias network 112, and the second voltage distribution network 118 arranged as a second switching circuit 130. FIG. 1C further shows the gate bias source 124, the source/drain bias source 126, the plurality of switching circuits 128, 130 each coupled in parallel between the gate bias source 124 and the source/drain bias source 126, and each including the corresponding transistor (e.g., transistors 106, 108) coupled in series with the corresponding transistor of each of the other switching circuits. The direct current bias network 114 is interposed between the source/drain bias source 126 and each switching circuit 128, 130 of the plurality of switching circuits.

In FIG. 1C, and as also shown in FIG. 1B, the first switching circuit 128 may include the first direct current bias network 110 and the first voltage distribution network 116 (in addition to the first transistor 106), and the second switching circuit 130 may include the second direct current bias network 112 and the second voltage distribution network 118 (in addition to the second transistor 108). While illustrated in FIG. 1C as an arrangement of two switching circuits (i.e., the first switching circuit 128 and the second switching circuit 130), in various other examples the radio-frequency circuit 100 may include any number of transistors, and, accordingly, any number of switching circuits. In such an arrangement, each individual switching circuit may include one or more transistors, a corresponding direct current bias network, and a corresponding voltage distribution network. Moreover, each switching circuit may be coupled to a shared direct current bias network, such as the direct current bias network 114 illustrated in FIG. 1C.

Figure 2:
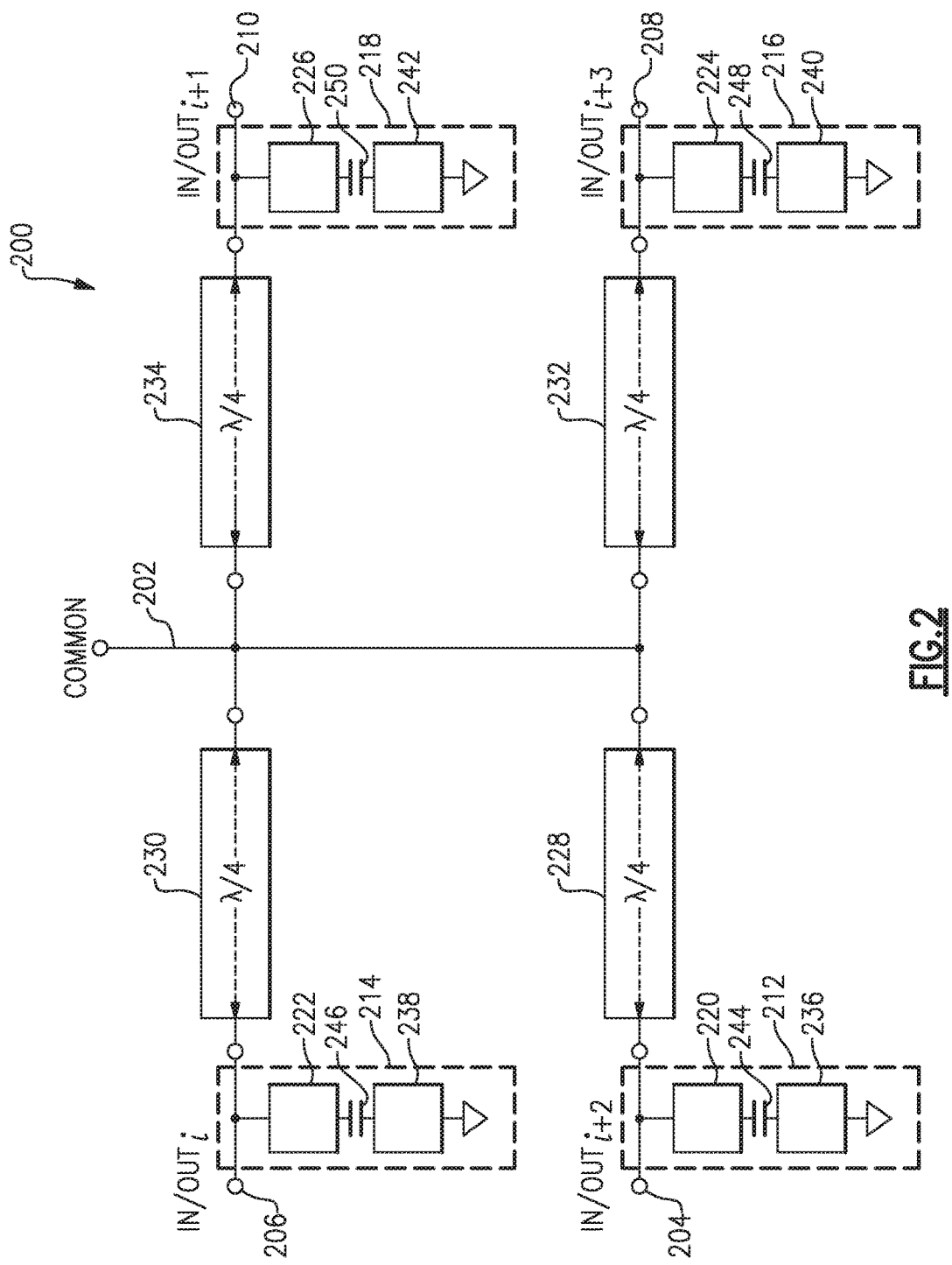
FIG. 2 is a block diagram of one example of a switching device according to aspects disclosed herein.

Referring to FIG. 2, illustrated is one example of a radio-frequency switching device 200 according to certain aspects. In particular, the example radio-frequency switching device 200 may incorporate one or more of the radio-frequency circuit 100 shown in FIG. 1A. In the illustrated example, the radio-frequency switching device 200 includes a signal input path 202 configured to receive a radio-frequency signal, a plurality of signal output paths 204, 206, 208, 210 (e.g., IN/OUT ports) each to provide the radio-frequency signal, and a plurality of radio-frequency sub-networks (e.g., first sub-network 212, second sub-network 214, third sub-network 216, and fourth sub-network 218). Each radio-frequency sub-network 212, 214, 216, 218 may be interposed between the signal input path 202 and a signal output path 204, 206, 208, 210 and positioned to route the radio-frequency signal between the signal input path 202 and that signal output path 204, 206, 208, 210. In FIG. 2, the first sub-network 212 is coupled to the signal output path 204, the second sub-network 214 is coupled to the signal output path 206, the third sub-network 216 is coupled to the signal output path 208, and the fourth sub-network 218 is coupled to the signal output path 210.

While in FIG. 2, each IN/OUT port is described as an output path (e.g., signal output paths 204, 206, 208, 210) for the convenience of description, in various other implementations each IN/OUT port may be used as an input path, and the signal input path 202 may be used as the output path. Moreover, while FIG. 2 illustrates one example of a single pole four-throw radio-frequency switching device for the sake of illustration, various aspects and examples discussed herein are not so limited. That is, the radio-frequency switching device 200 may include any number of sub-networks, and accordingly, any pole-count and/or any throw count. For instance, the radio-frequency switching device 200 may include two sub-networks for a single pole double-throw arrangement, two sub-networks for a double-throw double pole arrangement, or three sub-networks for a single pole triple throw arrangement, to name a few examples.

Each of the radio-frequency sub-networks 212, 214, 216, 218 within the example radio-frequency switching device 200 illustrated in FIG. 2 may include one or more radio-frequency circuits (shown generally as circuits 220, 222, 224, 226, 236, 238, 240, 242), each radio-frequency circuit having a series of transistors, similar to the radio-frequency circuit 100 illustrated in FIG. 1A. Interposed between the radio-frequency circuits of each radio-frequency sub-networks 212, 214, 216, 218 is a direct current blocking network (e.g., direct current blocking networks 244, 246, 248, 250). Each radio-frequency circuit within a sub-network may be coupled in series and may be implemented on a shared die, as further discussed below with reference to FIG. 4.

Figure 3:
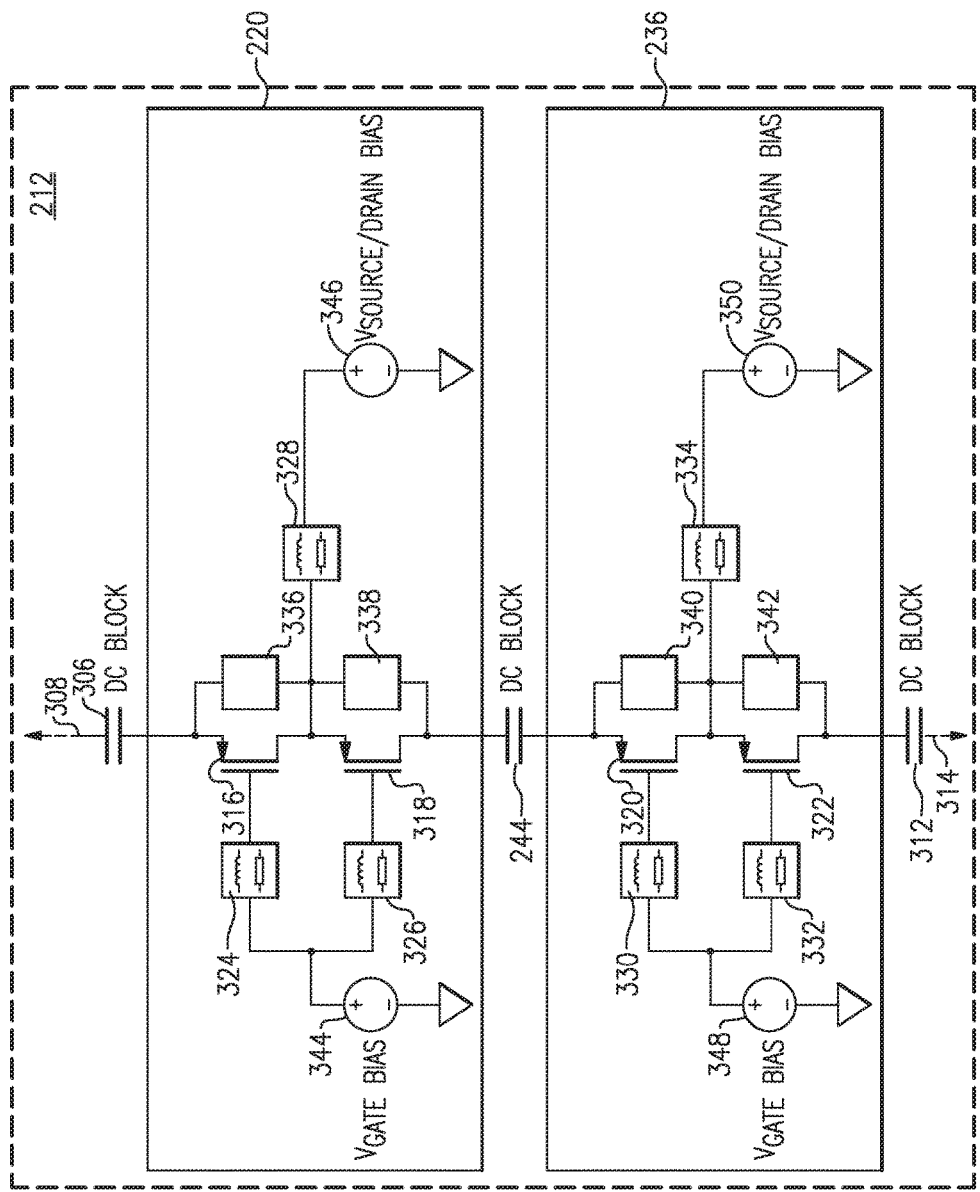
FIG. 3 is a block diagram of one example of a radio-frequency sub-network which may be included within the example switching device of FIG. 2, according to aspects disclosed herein.

FIG. 3 shows one example of an enhanced view of the radio-frequency sub-network 212 of the radio-frequency switching device 200 shown in FIG. 2. In particular, FIG. 3 shows the first radio-frequency circuit 220 of the sub-network 212 coupled in series with the second radio-frequency circuit 236 of the sub-network 212. A first direct current blocking network 244 is interposed between the first radio-frequency circuit 220 and the second radio-frequency circuit 236, a second direct current blocking network 306 is coupled to the input path 308 of the first radio-frequency circuit 220, and a third direct current blocking network 312 is coupled to the output path 314 of the second radio-frequency circuit 236. FIG. 3 shows two radio-frequency circuits 220, 236 for the convenience of illustration, and in various other examples, each radio-frequency sub-network 212, 214, 216, 218 shown in FIG. 2 may include any suitable number of radio-frequency circuits. Additional radio-frequency circuits may be coupled to the second radio-frequency circuit 236 in a manner similar to which the second radio-frequency circuit 236 is coupled to the first radio-frequency circuit 220.

Similar to the radio-frequency circuit 100 illustrated in FIG. 1A, each radio-frequency circuit 220, 236 may include a series of one or more transistors (e.g., first transistors 316, 320 and second transistors 318, 322), a plurality of direct current bias networks (e.g., first direct current bias networks 324, 330, second direct current bias networks 326, 332, and third direct current bias networks 328, 334), and a plurality of voltage distribution networks (e.g., first voltage distribution networks 336, 340 and second voltage distribution networks 338, 342). Each direct current bias network 324, 326, 328, 330, 332, 334 may be coupled to a corresponding bias voltage source such as the gate bias sources 344, 348 and the source/drain bias sources 346, 350.

Returning to FIG. 2, the input path of at least one of the radio-frequency circuits of a corresponding radio-frequency sub-network 212, 214, 216, 218 may be coupled to the signal input path 202 of the radio-frequency switching device 200. Similarly, the output path of at least one of the radio-frequency circuits of the corresponding radio-frequency sub-network 212, 214, 216, 218 may be coupled to at least one of the output signal paths 204, 206, 208, 210 of the radio-frequency switching device 200. As such, control of each individual radio-frequency sub-network 212, 214, 216, 218, and the radio-frequency circuits therein, may selectively route a radio-frequency signal received at the signal input path 202 to a desired signal output path 204, 206, 208, 210.

In various examples, the radio-frequency switching device 200 includes a plurality of transmission lines, each transmission line interposed between the signal input path 202 and one of the radio-frequency sub-networks 212, 214, 216, 218. Specifically, each transmission line may couple the signal input path 202 to an input path of a radio-frequency circuit within a given radio-frequency sub-network 212, 214, 216, 218. Referring to the example of FIG. 2, the illustrated radio-frequency switching device 200 includes a first transmission line 228 coupled to the first radio-frequency sub-network 212, a second transmission line 230 coupled to the second radio-frequency sub-network 214, a third transmission line 232 coupled to the third radio-frequency sub-network 216, and a fourth transmission line 234 coupled to the fourth radio-frequency sub-network 218.

In certain examples, each transmission line 228, 230, 232, 234 includes a ¼ wave transformer, similar to the ¼ wave transformer included within the direct current bias networks 110, 112, 114 discussed with reference to FIG. 1. As discussed above, each ¼ wave transformer transforms the impedance on the output end of the corresponding transmission line (e.g., the radio-frequency sub-network end) to appear as the compliment on the input end (e.g., the signal input path end). Accordingly, when each transistor within the radio-frequency circuits of a radio-frequency sub-network is in an "ON" state, the signal input path 202 will see a high impedance (e.g., open circuit), and power will not flow to the corresponding radio-frequency sub-network 212, 214, 216, 218. In contrast, when each transistor within the radio-frequency circuits of the radio-frequency sub-network is in an "OFF" state (e.g., short circuit), the signal input path 202 will see the load impedance of the corresponding radio-frequency sub-network.

For example, referring to the radio-frequency sub-networks 214, 218, if the transistors within the radio-frequency circuits 222, 238, 220, 236, 224, 240 are biased in the "ON" state, and the transistors within the radio-frequency circuits 226, 242 are biased in the "OFF" state, the impedance at the signal input path 202 (e.g., COMMON port) would be the impedance value of the system (e.g., 50 ohms for a 50 ohm system) at the designed radio-frequency signal frequency. Similarly, the impedance at the output 210 (e.g., IN/OUT (i+1) port) would be the impedance value of the system at the designed radio-frequency signal frequency. Since the impedance looking into the input of each ¼ wave transformer is the compliment of the impedance on the opposite side, if the transistors in radio-frequency circuits 222, 238 are biased in the "ON" state, the impedance looking into the transmission line 230 from the signal input path 202 would be high (e.g., infinite in an ideal case). Accordingly, the received radio-frequency signal avoids this path, and is diverted to the signal output path 210 of the radio-frequency sub-network 218. Likewise, if a signal is applied to the signal output path 210, it will be directed to the signal input path 202. Similar operations may be performed by the radio-frequency sub-networks 212, 214, 216.

Accordingly, various aspects and examples discussed herein provide high power switching functionality without the significant power (e.g., direct current bias current or voltage) requirements of conventional high radio-frequency signal power switching devices. As discussed above, aspects and examples of the circuits, devices, and processes discussed herein can meet low power objectives for a range of such conditions, providing stable performance regardless of the radio-frequency signal power. Specifically, aspects and examples may be adapted to scale according to radio-frequency signal power handling requirements and to accommodate high power/voltage radio-frequency signals conditions with minimal direct current bias current or voltages. Accordingly, various aspects and examples disclosed herein may provide important functionality that is not available from conventional radio-frequency devices.

A radio-frequency circuit in accord with the aspects and examples described herein may be implemented in a number of topologies and physical technologies. Any of the components thereof may be implemented in a substrate or in a die and may be designed for and manufactured from various semiconductor materials, such as Silicon (Si), Germanium (Ge), Gallium arsenide (GaAs), for example, using various design technologies, such as complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies. In certain examples, the die(s) may be mounted upon or coupled to a substrate and packaged within a module.

Figure 4:
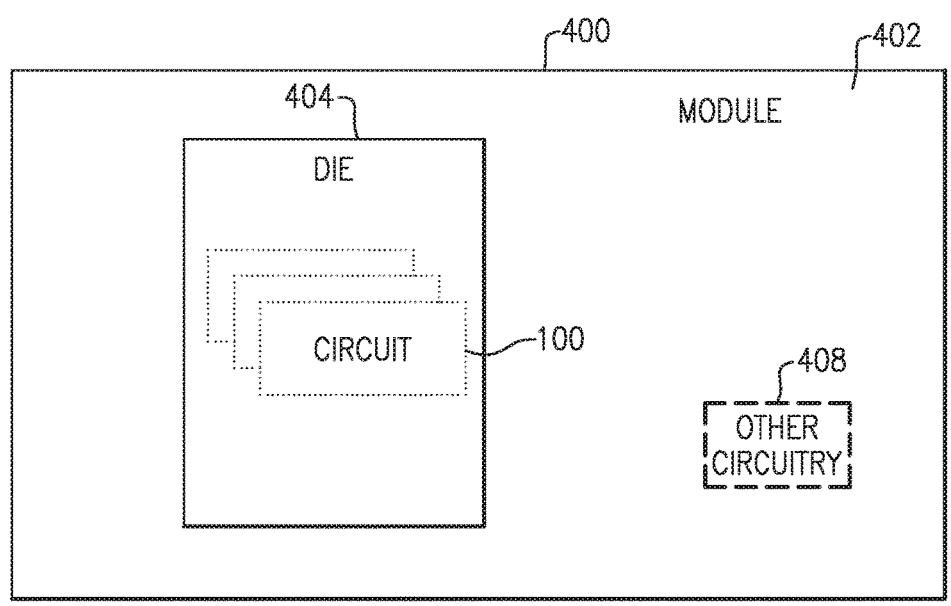
FIG. 4 is a block diagram of one example of a radio-frequency module according to aspects disclosed herein.

FIG. 4 is a block diagram of one example of a module 400 that can include an implementation of the radio-frequency circuit 100 illustrated in FIG. 1A. The illustrated module 400 of FIG. 4 is discussed within continuing reference to the radio-frequency circuit illustrated in FIG. 1A.

In the illustrated example of FIG. 4, the module 400 includes a packaging substrate 402 that is configured to receive a plurality of components. In some examples, such components can include a die 404 having components of the radio-frequency circuit 100 described herein, such as the series of transistors 106, 108, the plurality of direct current bias networks 110, 112, 114, the plurality of voltage distribution networks 116, 118, and/or the one or more direct current blocking networks 120, 122. In some examples, other circuitry or components 408 can be mounted on or formed on the packaging substrate 402. In some examples, the packaging substrate 402 can include a laminate substrate.

In some examples, the module 400 can also include one or more packaging structures to, for example, provide protection and facilitate easier handling of the module 400. Such a packaging structure can include an overmold formed over the packaging substrate 402 and dimensioned to substantially encapsulate the various dies and components thereon. As discussed above, it will be understood that although the module 400 is described in the context of wirebond-based electrical connections, one or more features of the present disclosure can also be implemented in other packaging configurations, including flip-chip configurations.

Figure 5:
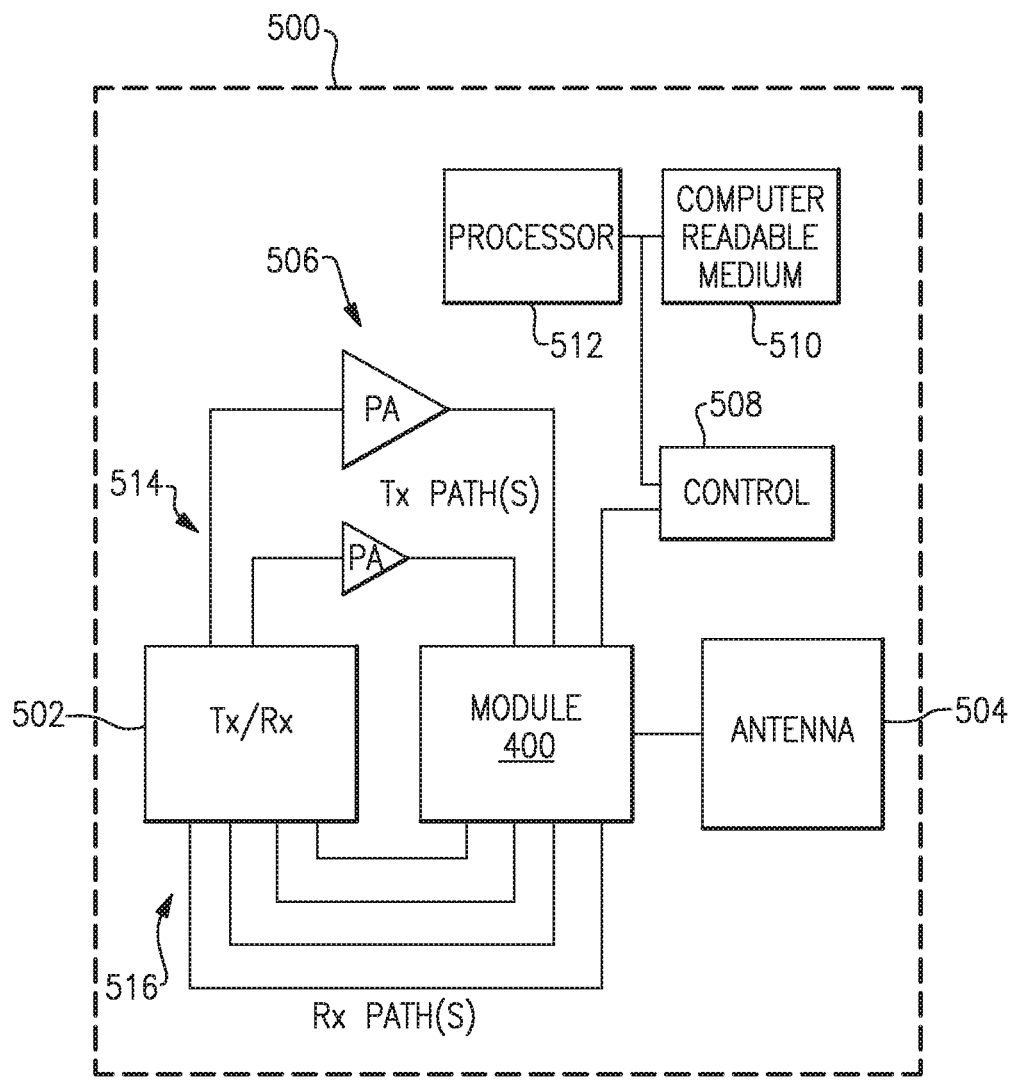
FIG. 5 is a block diagram of one example of a communication terminal in which implementations of the radio-frequency module of FIG. 4 may be used, according to aspects disclosed herein.

FIG. 5 is a block diagram of one example of a communication terminal 500 in which the example module 400 of FIG. 4 can be used. While in one example the communication terminal 500 may be a base-station side of a wireless network where radio-frequency signal power is naturally high (e.g., 100 Watts), in certain other examples the communication terminal 500 may be a wireless communication device. The example wireless device can be a mobile device, such as a smart phone or tablet, for example. By way of example, the communication terminal 500 can communicate in accordance with Long Term Evolution (LTE). In this example, the communication terminal 500 can be configured to operate at one or more frequency bands defined by an LTE standard. The communication terminal 500 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 5, the communication terminal 500 can include a transceiver 502, an antenna 504, power amplifiers 506, a control component 508, a computer readable storage medium 510, and at least one processor 512. The module 400 can be electrically coupled to one or more components of the of the power amplifiers 506. As will be appreciated by those skilled in the art, the communication terminal 500 can include elements that are not illustrated in FIG. 5 and/or a sub-combination of the illustrated elements.

The transceiver 502 can generate radio-frequency signals for transmission via the antenna 504. Furthermore, the transceiver 502 can receive incoming radio-frequency signals from the antenna 504. It will be understood that various functionalities associated with transmitting and receiving of radio-frequency signals can be achieved by one or more components that are collectively represented in FIG. 5 as the transceiver 502. For example, a single component can be configured to provide both transmitting and receiving functionalities. In another example, transmitting and receiving functionalities can be provided by separate components.

In FIG. 5, one or more output signals from the transceiver 502 are depicted as being provided to the antenna 504 via one or more transmission paths 514 through the module 400. In the example illustrated, different transmission paths 514 can represent output paths associated with different frequency bands (e.g., a high band and a low band) and/or different power outputs. Similarly, one or more signals from the antenna 504 are depicted as being provided to the transceiver 502 via one or more receive paths 516 through the module 400. In the example illustrated, different receive paths 516 can represent paths associated with different signaling modes and/or different receive frequency bands. The communication terminal 500 can be adapted to include any suitable number of transmission paths 514 or receive paths 516. The transmission paths 514 can include one or more power amplifiers 506 to aid in boosting a radio-frequency signal having a relatively low power to a higher power suitable for transmission.

In certain examples, the antenna 504 can be connected to an antenna terminal on the module 400. Similarly, the transceiver 502 can be connected to a radio-frequency terminal on the module 400 via one or more of the transmission paths 514 or receive paths 516. As discussed above, according to certain examples, the module 400 can direct a received radio-frequency signal and facilitate switching between receive and/or transmit paths, by selectively electrically connecting the antenna 504 to a selected transmit or receive path. Thus, one or more of the transmission paths 514 can be active while one or more of the other transmission paths 514 are non-active, and similarly for the receive paths 516. The module 400 can provide a number of switching functionalities associated with an operation of the communication terminal 500.

In certain examples, at least one processor 512 can be configured to facilitate implementation of various processes on the communication terminal 500. At least one processor 512 can be, for example, a special purpose processor. In certain implementations, the communication terminal 500 can include a non-transitory computer readable medium 510, such as a memory, which can store computer program instructions that may be provided to and executed by the at least one processor 512.

Some of the implementations described above have provided examples in connection with mobile devices. However, the principles and advantages of the examples can be used for any other systems or apparatus, such as any uplink cellular device, that could benefit from any of the circuits described herein. Any of the principles and advantages discussed herein can be implemented in an electronic system that uses transistor based switches. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

Figure 6:
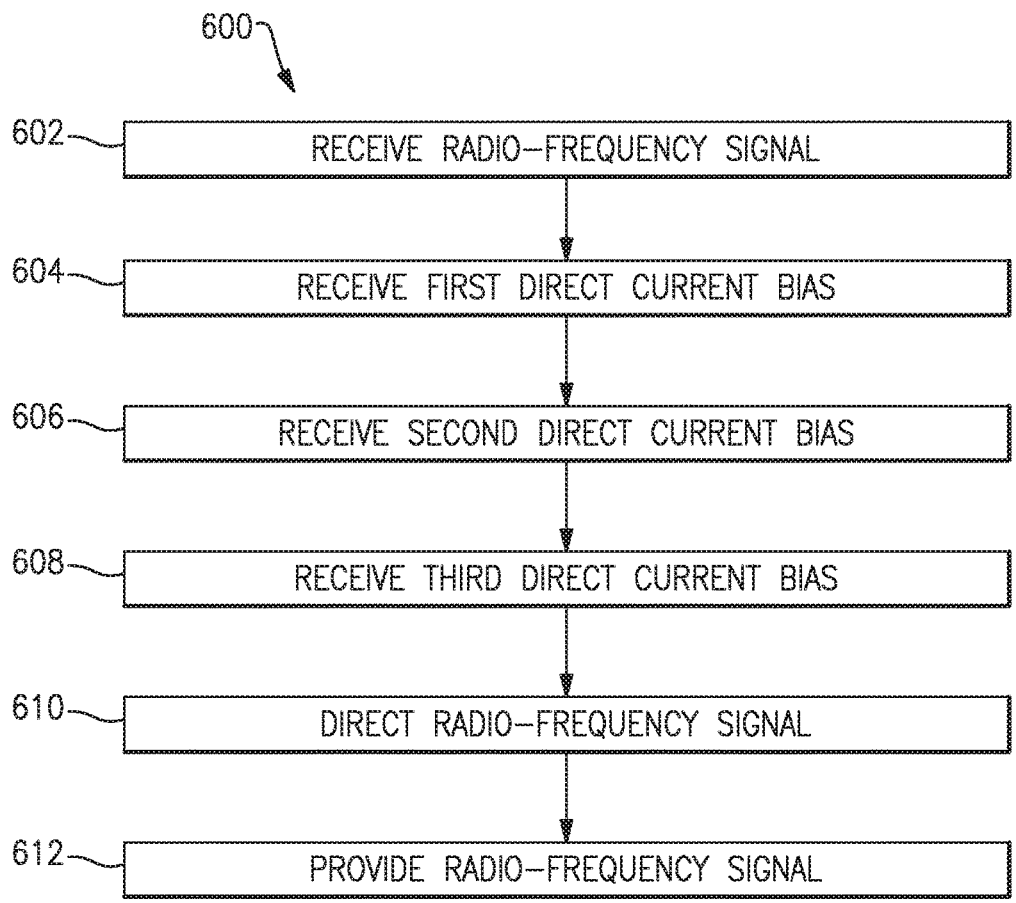
FIG. 6 is a process flow illustrating one example of a process for providing a radio-frequency signal according to aspects disclosed herein.

As described above with reference to at least FIGS. 1A-1C, 2, and 3, several examples perform processes that provide a radio-frequency signal. In some examples, these processes are executed by components of radio-frequency circuit, such as the radio-frequency circuit 100 described above with reference to FIGS. 1A-1C. One example of such a process is illustrated in FIG. 6. FIG. 6 is described with continuing reference to at least the radio-frequency circuit 100 shown in FIGS. 1A-1C.

In the illustrated example of FIG. 6, the process 600 may include the acts of receiving a radio-frequency signal, receiving a first direct current bias from a first direct current bias network, receiving a second direct current bias from a second direct current bias network, receiving a third direct current bias from a third direct current bias network, directing the radio-frequency signal, and providing the radio-frequency signal at an output path. While not explicitly illustrated in the example process flow of FIG. 6, in various examples the process 600 may include additional acts and processes. Such acts and process are discussed above in further detail with regards to the radio-frequency circuit 100 shown in FIGS. 1A-1C, and the example radio-frequency switching device 200 shown in FIG. 2.

In act 602, the process 600 may include receiving a radio-frequency signal, such as an amplified radio-frequency signal, at an input path. For example, the process 600 may include receiving the radio-frequency signal from an output transmission line of a radio-frequency power amplifier in series or in shunt with the series of transistors 106, 108 of the radio-frequency circuit 100. As discussed above with reference to at least FIG. 1A, the radio-frequency signal may be used for numerous purposes, such as driving the antenna of a communication terminal. Once received at the input path, the process 600 may include one or more acts of controlling a state of each transistor 106, 108 to manage the propagation of the radio-frequency signal to the output path.

In act 604, the process 600 may include receiving a first direct current bias from a first direct current bias network 110 at a first transistor 106. In particular, act 604 may include applying a bias current or voltage (e.g., a first direct current bias current or voltage) to the corresponding first transistor 106 to directly bias the first transistor 106. As discussed above, each transistor 106, 108 may include a field effect transistor having a gate, a source, and a drain. In certain examples, the first direct current bias network 110 may be coupled to the gate of the first transistor 106, and the process 600 may include receiving the first bias current or voltage from the first direct current bias network 110 at the gate of the first transistor 106.

In act 606, the process 600 may include receiving a second direct current bias from a second direct current bias network 112 at a second transistor 108. In particular, act 606 may include applying a bias current or voltage (e.g., a second direct current bias current or voltage) to the corresponding second transistor 108 to directly bias the second transistor 108. In certain examples, the second direct current bias network 112 may be coupled to the gate of the second transistor 108, and the process 600 may include receiving the second bias current or voltage from the second direct current bias network 112 at the gate of the second transistor 108.

In act 608, the process 600 may include receiving a third direct current bias from a third direct current bias network 114 at the drain of the first transistor 106 and the source of the second transistor 108. Accordingly, the process 600 may include applying a bias current or voltage (e.g., a third direct current bias current or voltage) to the drain of the first transistor 106 to directly bias the first transistor 106, and applying a bias current or voltage (e.g., the third direct current bias current or voltage) to the source of the second transistor 108 to directly bias the second transistor 108.

In act 610, the process 600 may include directing the radio-frequency signal from the input path through the first transistor 106 and the second transistor 108. In act 610, the process 600 may include controlling each direct current bias network to maintain (or switch) each transistor 106, 108 within the series of transistors to a desired state of operation (i.e., saturation mode or cutoff mode). Specifically, each direct current bias network 110, 112, 114 may be driven by a coupled bias source to switch the corresponding transistor 106, 108 between an "ON" state and an "OFF" state, or between the "OFF" state and the "ON" state. Control of each transistor 106, 108 between the "ON" state and the "OFF" state, or vice versa, controls the propagation of the radio-frequency signal from the input path to the output path, and selectively directs the radio-frequency signal. In act 612, the process 600 may include providing the radio-frequency signal at an output path.

Accordingly, various aspects and examples discussed herein replace PIN diodes with field effect transistors to enable high power radio-frequency switching based on a comparatively low direct current bias current or voltage. Particular aspects and implementations may include one or more direct current bias networks, and one or more direct current blocking networks, to directly bias each field effect transistor within the switching circuit to allow the circuit to scale accordingly under increasingly large radio-frequency signal power. Moreover, the one or more direct current bias networks individually bias each field effect transistor to ensure proper operation of each field effect transistor within the circuit regardless of the radio-frequency signal power handling requirements.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A radio-frequency circuit comprising:
a series of transistors including at least a first transistor and a second transistor and each having at least a source, a gate, and a drain;
an input path coupled to the source of the first transistor and an output path coupled to the drain of the second transistor; and
a plurality of direct current bias networks including a first direct current bias network coupled to the gate of the first transistor, a second direct current bias network coupled to the gate of the second transistor, and a third direct current bias network coupled to the drain of the first transistor and the source of the second transistor, each of the plurality of direct current bias networks being configured to directly bias the series of transistors to direct a radio-frequency signal through the series of transistors.

2. The radio-frequency circuit of claim 1 further comprising a first voltage distribution network coupled to the source of the first transistor and the third direct current bias network.

3. The radio-frequency circuit of claim 2 further comprising a second voltage distribution network coupled to the drain of the second transistor and the third direct current bias network.

4. The radio-frequency circuit of claim 3 wherein the first transistor is a first field effect transistor and the second transistor is a second field effect transistor.

5. The radio-frequency circuit of claim 4 further comprising a gate bias source coupled to the first direct current bias network and the second direct current bias network.

6. The radio-frequency circuit of claim 5 further comprising a source/drain bias source coupled to the third direct current bias network.

7. The radio-frequency circuit of claim 1 further comprising an input path configured to receive the radio-frequency signal from a transmission line of a radio-frequency power amplifier.

8. The radio-frequency circuit of claim 7 further comprising a first direct current blocking network coupled to an output path of the radio-frequency circuit.

9. The radio-frequency circuit of claim 8 further comprising a second direct current blocking network coupled to the input path of the radio-frequency circuit.

10. The radio-frequency circuit of claim 1 wherein at least one of the plurality of direct current bias networks is a ¼ wavelength transformer.

11. A radio-frequency switching device comprising:
an input path configured to receive a radio-frequency signal;
a plurality of radio-frequency sub-networks each coupled to the input path and configured to direct the radio-frequency signal, each of the plurality of sub-networks including at least a first radio-frequency circuit having a first series of directly biased transistors, a second radio-frequency circuit having a second series of directly biased transistors, and a direct current blocking network interposed between the first radio-frequency circuit and the second radio-frequency circuit; and
a plurality of output paths each configured to provide the radio-frequency signal, each output path of the plurality of output paths corresponding to a respective one of the plurality of radio-frequency sub-networks.

12. The radio-frequency switching device of claim 11 further comprising a plurality of transmission lines, at least one of the plurality of transmission lines being interposed between the input path and a corresponding one of the plurality of radio-frequency sub-networks.

13. The radio-frequency switching device of claim 12 wherein each of the plurality of transmission lines is a ¼ wavelength transformer.

14. The radio-frequency switching device of claim 13 wherein the first radio-frequency circuit further includes a first plurality of direct current bias networks configured to directly bias the first series of transistors, and the second radio-frequency circuit further includes a second plurality of direct current bias networks configured to directly bias the second series of transistors.

15. The radio-frequency switching device of claim 14 wherein the first radio-frequency circuit further includes a first voltage distribution network coupled to at least one of the first plurality of direct current bias networks, and the second radio-frequency circuit further includes a second voltage distribution network coupled to at least one of the second plurality of direct current bias networks.

16. The radio-frequency switching device of claim 11 wherein the first series of transistors includes a first transistor and a second transistor, and the second series of transistors includes a third transistor and a fourth transistor.

17. The radio-frequency switching device of claim 16 wherein each of the first transistor, the second transistor, the third transistor, and the fourth transistor is a field effect transistor.

18. A method for providing a radio-frequency signal, the method comprising:
 receiving a radio-frequency signal at an input path;
 receiving a first direct current bias from a first direct current bias network at a gate of a first transistor;
 receiving a second direct current bias from a second direct current bias network at a gate of a second transistor;
 receiving a third direct current bias from a third direct current bias network at a drain of the first transistor and a source of the second transistor;
 directing the radio-frequency signal from the input path through the first transistor and the second transistor; and
 providing the radio-frequency signal at an output path.

19. The method of claim 18 further comprising distributing the third direct current bias to a source of the first transistor with a first voltage distribution network coupled to the third direct current bias network.

20. The method of claim 19 further comprising distributing the third direct current bias to a drain of the second transistor with a second voltage distribution network coupled to the third direct current bias network.

21. The method of claim 20 further comprising blocking at least one of the first direct current bias and the second direct current bias with a direct current blocking network coupled to the output path.

* * * * *